(12) United States Patent  
Simon

(10) Patent No.: US 7,823,044 B2  
(45) Date of Patent: Oct. 26, 2010

(54) METHOD FOR STREAMLINING ERROR CONNECTION CODE COMPUTATION WHILE READING OR PROGRAMMING A NAND FLASH MEMORY

(75) Inventor: Jean-Yves Simon, St. Laurent du Var (FR)

(73) Assignee: Texas Instruments Incorporated, Dallas, TX (US)

( * ) Notice: Subject to any disclaimer, the term of this patent is extended or adjusted under 35 U.S.C. 154(b) by 611 days.

(21) Appl. No.: 10/764,670

(22) Filed: Jan. 26, 2004

(65) Prior Publication Data

US 2005/0125708 A1 Jun. 9, 2005

(51) Int. Cl.  
*G11C 29/00* (2006.01)

(52) U.S. Cl. .................. 714/763; 714/746; 714/758

(58) Field of Classification Search ............... 714/763, 714/5, 6, 8, 710, 746, 758; 711/103, 154; 365/185.03; 375/295  
See application file for complete search history.

(56) References Cited

U.S. PATENT DOCUMENTS

| | | | | |
|---|---|---|---|---|
| 6,018,778 A * | 1/2000 | Stolowitz | ..................... | 710/61 |
| 6,034,891 A * | 3/2000 | Norman | .................. | 365/185.09 |
| 6,131,139 A * | 10/2000 | Kikuchi et al. | ............... | 711/103 |
| 6,353,553 B1 * | 3/2002 | Tamada et al. | ......... | 365/185.03 |
| 6,426,893 B1 * | 7/2002 | Conley et al. | .......... | 365/185.11 |
| 6,438,039 B1 * | 8/2002 | Liu et al. | ................ | 365/185.33 |
| 6,510,537 B1 | 1/2003 | Lee | | |
| 6,580,638 B2 * | 6/2003 | Conley et al. | .......... | 365/185.11 |
| 6,594,792 B1 * | 7/2003 | Hladik et al. | ................ | 714/755 |
| 6,683,817 B2 * | 1/2004 | Wei et al. | ................ | 365/230.03 |
| 6,883,131 B2 * | 4/2005 | Acton | ......................... | 714/755 |
| 6,906,961 B2 * | 6/2005 | Eggleston et al. | ....... | 365/185.29 |
| 2001/0001327 A1 | 5/2001 | Tamura et al. | | |
| 2004/0221098 A1 * | 11/2004 | Ito et al. | ..................... | 711/106 |
| 2005/0111567 A1 * | 5/2005 | Hsu et al. | .................. | 375/295 |

* cited by examiner

*Primary Examiner*—Fritz Alphonse  
(74) *Attorney, Agent, or Firm*—Wade J. Brady, III; Frederick J. Telecky, Jr.

(57) ABSTRACT

A method for streamlining error correction code computation while reading or programming a NAND flash memory. At least some of the illustrative embodiments are methods comprising transferring a data block between a flash memory and a memory controller, and computing an ECC for said data block while transferring the data block.

26 Claims, 4 Drawing Sheets

METHOD FOR STREAMLINING ERROR CONNECTION CODE COMPUTATION WHILE READING OR PROGRAMMING A NAND FLASH MEMORY

PRIORITY CLAIM

This application claims priority to EPO Patent Application Serial No. 03293051.3, filed on Dec. 4, 2003, entitled "STREAMLINING ECC COMPUTATION WHILE READING OR PROGRAMMING A FLASH MEMORY," incorporated herein by reference.

BACKGROUND

Computers may comprise various types of memory for storing data. Each of these types of memory has various advantages that suit different applications. Flash memory, for example, is a solid state device used for fast and efficient memory storage. Examples of flash memory comprise a computer's BIOS chip, a memory stick, compact flash cards, SmartMedia™ cards and PCMCIA memory cards.

High-speed programming and erasing capabilities, low cost, ease of memory expansion, long lifespan and a file memory architecture make NAND Flash memory particularly useful in data-centric applications. NAND Flash memory has an input-output ("I/O") interface and uses a protocol that includes fast read/write/erase commands, addresses and data. Despite the advantages, NAND Flash memory does not permit easy access to a random memory address. NAND Flash memory also may be prone to low reliability due to random errors generated by physical effects in the geometry of the NAND gates in the memory. Such random errors also may be caused by an excessive number of read, write and erase cycles.

To correct such errors, a host processor may use a NAND Flash controller ("controller") to generate an error correction code ("ECC"). For the purposes of error checking and correction, an ECC may be generated when programming a NAND Flash with a particular data. Another ECC may be generated when reading the particular data from the NAND Flash. The two ECCs subsequently may be compared to locate and correct any differences which may represent errors caused by the NAND Flash memory.

Because NAND Flash memory typically is accessed in blocks of data, the controller may be forced to wait until a full block of data has been accessed before computing the ECC, thereby incurring a penalty in performance. Additionally, because a controller may have a limited number of registers in which to store completed ECC computations, the controller may pause several times to dump the contents of the register(s) to clear register space for new, completed ECC computations, resulting in further performance penalties. A method to compute and store the ECC without suffering a loss in performance is desirable.

BRIEF SUMMARY

The problems noted above are solved in large part by a method for streamlining ECC computation while reading or programming a NAND Flash memory. One exemplary embodiment may comprise transferring a data block between a flash memory and a memory controller and computing an error correction code while transferring the data block.

BRIEF DESCRIPTION OF THE DRAWINGS

For a detailed description of exemplary embodiments of the invention, reference will now be made to the accompanying drawings in which.

NOTATION AND NOMENCLATURE

Certain terms are used throughout the following description and claims to refer to particular system components. As one skilled in the art will appreciate, various companies may refer to a component by different names. This document does not intend to distinguish between components that differ in name but not function. In the following discussion and in the claims, the terms "including" and "comprising" are used in an open-ended fashion, and thus should be interpreted to mean "including, but not limited to . . . . " Also, the term "couple" or "couples" is intended to mean either an indirect or direct electrical connection. Thus, if a first device couples to a second device, that connection may be through a direct electrical connection, or through an indirect electrical connection via other devices and connections.

DETAILED DESCRIPTION

The following discussion is directed to various embodiments of the invention. Although one or more of these embodiments may be preferred, the embodiments disclosed should not be interpreted, or otherwise used, as limiting the scope of the disclosure, including the claims. In addition, one skilled in the art will understand that the following description has broad application, and the discussion of any embodiment is meant only to be exemplary of that embodiment, and not intended to intimate that the scope of the disclosure, including the claims, is limited to that embodiment.

Figure 1B:
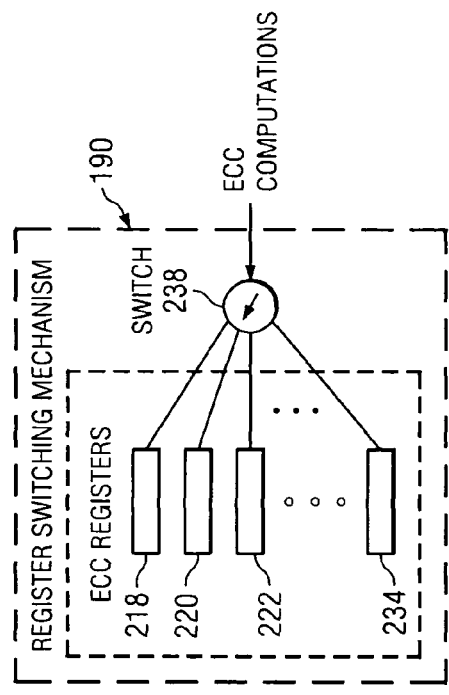
FIG. 1b illustrates a block diagram of a register switching mechanism in accordance with certain embodiments of the invention.
Figure 1A:
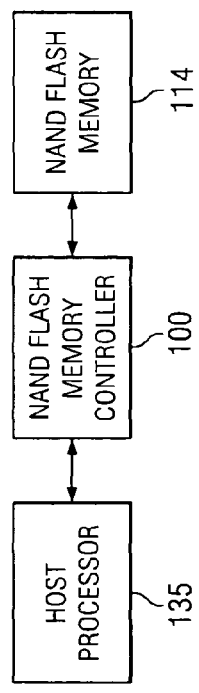
FIG. 1a illustrates a block diagram of a NAND Flash memory controller, a NAND Flash memory and a host processor in accordance with certain embodiments of the invention.

FIG. 1a illustrates a NAND Flash memory controller 100 coupled to a host processor 135 and a NAND Flash memory 114. The NAND Flash memory controller 100 may transfer data to and receive data from the NAND Flash memory 114. In some situations, data stored in the NAND Flash memory 114 may become corrupted.

The NAND Flash memory controller 100 may monitor data for accuracy by computing the ECC for each data transaction involving the NAND Flash memory 114. Specifically, the NAND Flash memory controller 100 may calculate the ECC upon writing a particular data into the NAND Flash memory 114. The ECC may be stored with the data. On a read transaction, the NAND Flash memory controller 100 may retrieve the target data and previously computed ECC, recalculate the ECC based on the retrieved data, and subsequently the host processor compares the newly recalculated ECC with the previously calculated ECC to locate and correct errors or discrepancies in the data. Because, in accordance with conventional NAND Flash memory, data entered into or retrieved from the NAND Flash memory 114 is in blocks of a finite size, the ECC may not be computed until the entire block has been written or read. Thus, the host processor 135 may suffer a loss in performance. The block size may be 256 or 512 bytes, but other block sizes are within the scope of this disclosure.

A full page of NAND Flash memory 114 may comprise a plurality of blocks of data. Thus, the NAND Flash memory controller 100 may read or write a plurality of blocks when reading or writing a full page of data. After each block of data is read or written, a typical NAND Flash memory controller 100 may calculate the ECC, transfer the ECC to the host processor 135, and then dump the ECC information. The amount of time lost in completing such processes may cause the host processor 135 to suffer a further loss in performance, especially if the transfer between the host processor and the controller is performed by a direct memory access device ("DMA"). In accordance with the preferred embodiment of the invention as described below, serialization of the ECC computation process and the addition of an automatic ECC register switching mechanism compensates for such performance losses One algorithm commonly used to compute an ECC is the Hamming algorithm. While the Hamming algorithm may be used with any number or bits and any amount of data, the following example illustrating the Hamming algorithm uses four bits and four packets of data.

The Hamming algorithm computes a series of parity bits using the XOR logic function (hereafter denoted by "^"). Table 1 below illustrates data rows A, B, C and D.

TABLE 1

| XOR operations performed to compute parity bits. | | | | | |
|---|---|---|---|---|---|
| A | A3 | A2 | A1 | A0 | X |
| B | B3 | B2 | B1 | B0 | Y |
| C | C3 | C2 | C1 | C0 | Z |
| D | D3 | D2 | D1 | D0 | T |
| R | R3 | R2 | R1 | R0 | |

Each column of row R contains the result of the XOR operation performed on all data present in the column. For example, R3=A3^B3^C3^D3. The X, Y, Z and T values are the results of the XOR operation performed on all bits present in the associated row. For example, X=A3^A2^A1^A0. Table 2 below includes all the XOR values for Table 1.

TABLE 2

| XOR computations performed for rows and columns of Table 1. | |
|---|---|
| R0 = A0^B0^C0^D0 | X = A3^A2^A1^A0 |
| R1 = A1^B1^C1^D1 | Y = B3^B2^B1^B0 |
| R2 = A2^B2^C2^D2 | Z = C3^C2^C1^C0 |
| R3 = A3^B3^C3^D3 | T = D3^D2^D1^D0 |

The series of parity bits generated by the Hamming algorithm may be used to represent the ECC. Tables 3a and 3b illustrate the generation of parity bits using the values of Table 2. Specifically, Table 3a illustrates the generation of column parities and Table 3b illustrates the generation of line parities.

TABLE 3a

| Column parity bits generated using the results of Table 2. | |
|---|---|
| P1o = R3 ^ R1 | P2o = R3 ^ R2 |
| P1e = R2 ^ R0 | P2e = R1 ^ R0 |

TABLE 3b

| Line parity bits generated using the results of Table 2. | | | |
|---|---|---|---|
| P4e = X ^ Z | P4o = Y ^ T | P8e = X ^ Y | P8o = Z ^ T |

The series of parity bits used to represent the ECC may be defined as:

$$P8oP4oP2oP1oP8eP4eP2eP1e, \quad (1)$$

where each parity bit of expression (1) is placed next to another parity bit of expression (1) to form an 8-bit parity that protects 16 bits of data. Parities may be of any appropriate size to protect a particular amount of data. Parity bits comprising "e" represent even data bits and parity bits comprising "o" represent odd data bits.

Because the Hamming algorithm used to compute the ECC uses XOR gates, the algorithm may be refined so that the ECC is computed while data is simultaneously read or written to the NAND Flash memory 114. Such a refined algorithm may be referred to as a serialized algorithm. The serialized algorithm may be illustrated in context of the computation of a parity bit. While the process illustrated in the following example is shown in the context of a read operation, the same process also may be applied to a write operation. As shown in Table 3a:

$$P1o=R3\text{^}R1=(A3\text{^}B3\text{^}C3\text{^}D3)\text{^}(A1\text{^}B1\text{^}C1\text{^}D1). \quad (2)$$

Because the XOR function is mathematically commutative and associative, expression (2) also may be expressed as:

$$P1o=(((A3\text{^}A1)\text{^}B3\text{^}B1)\text{^}C3\text{^}C1)\text{^}D3\text{^}D1. \quad (3)$$

The serialized algorithm comprises computing the parity bit while data is being read. Continuing with this example, if data row A of Table 1 is the first to be read from flash memory, then $$A3\text{^}A1 \quad (4)$$

may be computed and stored in any suitable storage area (e.g., a register or RAM). If data row B is the next to be read, then $$B3\text{^}B1 \quad (5)$$

may be computed. The modified algorithm is of a serialized nature and thus comprises computing as much of expression (3) as possible. Specifically, the XOR function may be applied to expressions (4) and (5) to produce $$(A3\text{^}A1)\text{^}(B3\text{^}B1) \quad (6)$$

and the result may be stored in any suitable storage area. If data row C is next, then $$C3\text{^}C1 \quad (7)$$

may be computed. The XOR function subsequently may be applied to expressions (6) and (7) to produce $$((A3\hat{\;}A1)\hat{\;}B3\hat{\;}B1)\hat{\;}C3\hat{\;}C1 \quad (8)$$

which may be stored in some temporary storage area. If data row D is the last to be read, then $$D3\hat{\;}D1 \quad (9)$$

may be computed. The XOR function subsequently may be applied to expressions (8) and (9) to produce $$(((A3\hat{\;}A1)\hat{\;}B3\hat{\;}B1)\hat{\;}C3\hat{\;}C1)\hat{\;}D3\hat{\;}D1 \quad (10)$$

which is the same as expression (3). The same process may be performed for all column parities.

A similar process may be used to compute the line parities of Table 3b. By way of an example, for a new ECC computation, $$P4e(0)=0$$

$$P4o(0)=0$$

$$P8e(0)=0$$

$$P8o(0)=0. \quad (11)$$

If a new data row A is read, $$X=A3\hat{\;}A2\hat{\;}A1\hat{\;}A0 \quad (12)$$

may be computed. The XOR function then may be applied to groups (11) and (12) to produce $$P4e(1)=P4e(0)\hat{\;}X=0\hat{\;}X=X$$

$$P4o(1)=P4o(0)\hat{\;}0=0\hat{\;}0=0$$

$$P8e(1)=P8e(0)\hat{\;}X=0\hat{\;}X=X$$

$$P8o(1)=P8o(0)\hat{\;}0=0\hat{\;}0=0. \quad (13)$$

Once data row B is read, $$Y=B3\hat{\;}B2\hat{\;}B1\hat{\;}B0 \quad (14)$$

may be computed. The XOR function then may be applied to groups (13) and (14) to produce $$P4e(2)=P4e(1)\hat{\;}0=X\hat{\;}0=X$$

$$P4o(2)=P4o(1)\hat{\;}Y=0\hat{\;}Y=Y$$

$$P8e(2)=P8e(1)\hat{\;}Y=X\hat{\;}Y=X\hat{\;}Y$$

$$P8o(2)=P8o(1)\hat{\;}0=0\hat{\;}0=0. \quad (15)$$

Assuming data row C is next, $$Z=C3\hat{\;}C2\hat{\;}C1\hat{\;}C0 \quad (16)$$

may be generated. The XOR function then may be applied to groups (15) and (16) to produce $$P4e(3)=P4e(2)\hat{\;}Z=X\hat{\;}Z=X\hat{\;}Z$$

$$P4o(3)=P4o(2)\hat{\;}0=Y\hat{\;}0=Y$$

$$P8e(3)=P8e(2)\hat{\;}0=X\hat{\;}Y\hat{\;}0=X\hat{\;}Y$$

$$P8o(3)=P8o(2)\hat{\;}Z=0\hat{\;}Z=Z. \quad (17)$$

If data row D is read last, $$T=D3\hat{\;}D2\hat{\;}D1\hat{\;}D0 \quad (18)$$

may be computed. The XOR function then may be applied to groups (17) and (18) to produce $$P4e(4)=P4e(3)\hat{\;}0=X\hat{\;}Z\hat{\;}0=X\hat{\;}Z$$

$$P4o(4)=P4o(3)\hat{\;}T=Y\hat{\;}T=Y\hat{\;}T$$

$$P8e(4)=P8e(3)\hat{\;}0=X\hat{\;}Y\hat{\;}0=X\hat{\;}Y$$

$$P8o(4)=P8o(3)\hat{\;}T=Z\hat{\;}T=Z\hat{\;}T. \quad (19)$$

In this manner, the serialized algorithm computes the parity bits representative of the ECC while data is read, whereas the original Hamming algorithm computes the parity bits after all data has been read. Thus, while both algorithms may result in a series of parity bits representative of the ECC as illustrated in expression (1), the serialized algorithm is more efficient than the original Hamming algorithm. One embodiment may comprise transferring a data block between a flash memory 114 and a memory controller 100 and computing an ECC for the data block while transferring the data block. Whereas the ECC of a data block is commonly computed after transferring the data block, this embodiment comprises computing the ECC of a data block while simultaneously transferring the data block, thereby increasing efficiency and significantly reducing performance loss.

In addition to the serialized algorithm, performance speed also may be increased by using an automatic ECC register switching mechanism. In many existing systems, the ECC is computed and then stored in a single ECC register. Such a register typically has a capacity of protecting 256 bytes or 512 bytes of memory. Thus, each time the register becomes full of data, the data must be saved to some external memory and the contents of the register must be dumped to create space for new ECC computations. This process is time consuming and inefficient, since a register may be dumped several times over the duration of a read or write operation.

The preferred embodiment of the invention comprises an automatic ECC register switching mechanism. As shown in FIG. 1*b*, the automatic ECC register switching mechanism 190 may comprise, among other things, a plurality of ECC registers 218-234 and a switch 238 to select one of the ECC registers 218-234, such as ECC register 218. Once an ECC register 218 becomes full with blocks of data, the switch 238 may select a second, empty ECC register 220 to store incoming ECC computations. Once the second ECC register 220 is full of data, the switch 238 may select a third, empty ECC register 222 to store incoming ECC computations. The process may continue in this fashion until all available ECC registers 218-234 are full of data, at which point the data may be saved to some appropriate, external memory and the ECC registers 218-234 may be dumped. The automatic switching mechanism 190 is more efficient than commonly-used technology because of the ability to store large amounts of data without pausing to empty the ECC registers 218-234.

Figure 2:
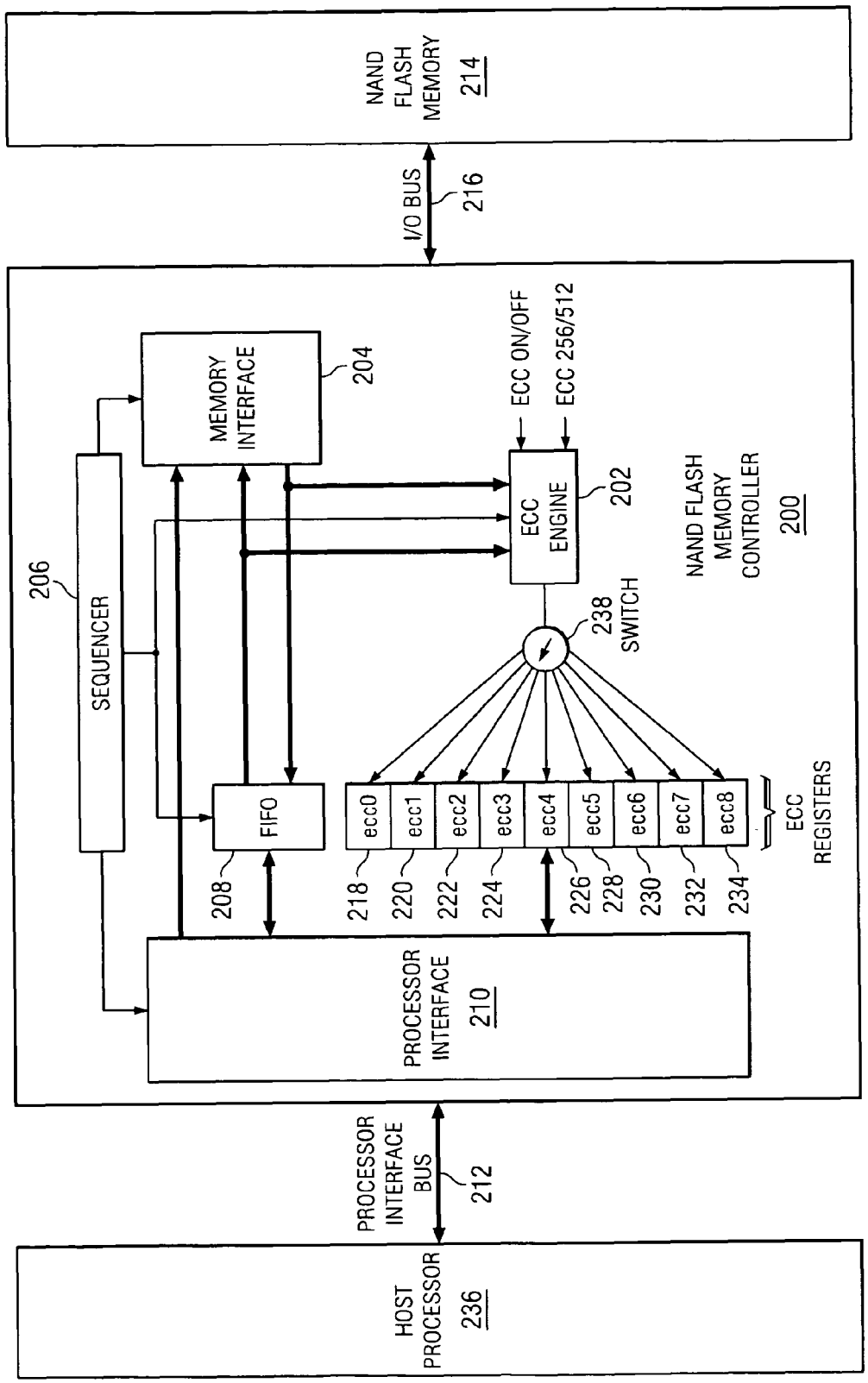
FIG. 2 illustrates a second block diagram of a NAND Flash memory controller, a NAND Flash memory and a host processor in accordance with certain embodiments of the invention.

The serialization of the ECC computation process and the automatic ECC register switching mechanism 190, as described above, may be combined to increase efficiency and avoid penalties in performance when computing the ECC. FIG. 2 illustrates a NAND Flash controller 200 coupled to a host processor 236 and a NAND Flash memory 214 by way of an interface bus 212 and an I/O bus 216, respectively. The NAND Flash controller 200 may comprise an ECC engine 202, a memory interface 204, a sequencer 206, a FIFO 208, a processor interface 210, ECC registers 218-234 and an ECC register switch 238.

The processor interface 210 is the primary interface for the host processor 236 to communicate with the controller 200.

The processor interface 210 comprises various registers to read or program the NAND Flash memory 214. The FIFO 208 may comprise a dedicated bank of registers that acts as a buffer to read or program the NAND Flash memory 214. The sequencer 206 may be a state machine to send data, addresses and commands to the NAND Flash memory 214. The memory interface 204 controls the timing of the signals that couple to the NAND Flash memory 214. The ECC engine 202 preferably computes the ECC for read and write operations.

The ECC engine 202 or other appropriate entity may set the switch 238 to select ECC register 218. When the host processor 236 reads the NAND Flash memory 214, a copy of the data may be routed to the ECC engine 202. The ECC engine 202 subsequently begins computing the ECC for the data using the serialized algorithm as described above. The ECC engine 202 preferably stores the ECC computations in ECC register 218. The ECC engine 202 may continue to compute the ECC for new data and store the results in ECC register 218 until no further data is available. Once either 256 bytes or 512 bytes have been reached (as indicated by an ECC256/512 signal), the switch 238 may point to ECC register 220 and the ECC computation process may continue. ECC computations may continue to be generated and stored in the ECC register 220 until 256 bytes or 512 have been reached (as indicated by the ECC256/512 signal to the ECC engine 202), whereupon the switch 238 may be set to ECC register 222. This process may be repeated until all ECC registers 218-234 are full of data and must be emptied. Because the size of a full page of NAND Flash memory is variable, the number of ECC registers present in the controller 200 also may vary.

When a full page of the NAND Flash memory 214 has been read, the ECC computations may be ready in the ECC registers 218-234. The host processor 236 may read the ECC registers 218-234 and the ECC registers 218-234 subsequently may be emptied.

Figure 3:
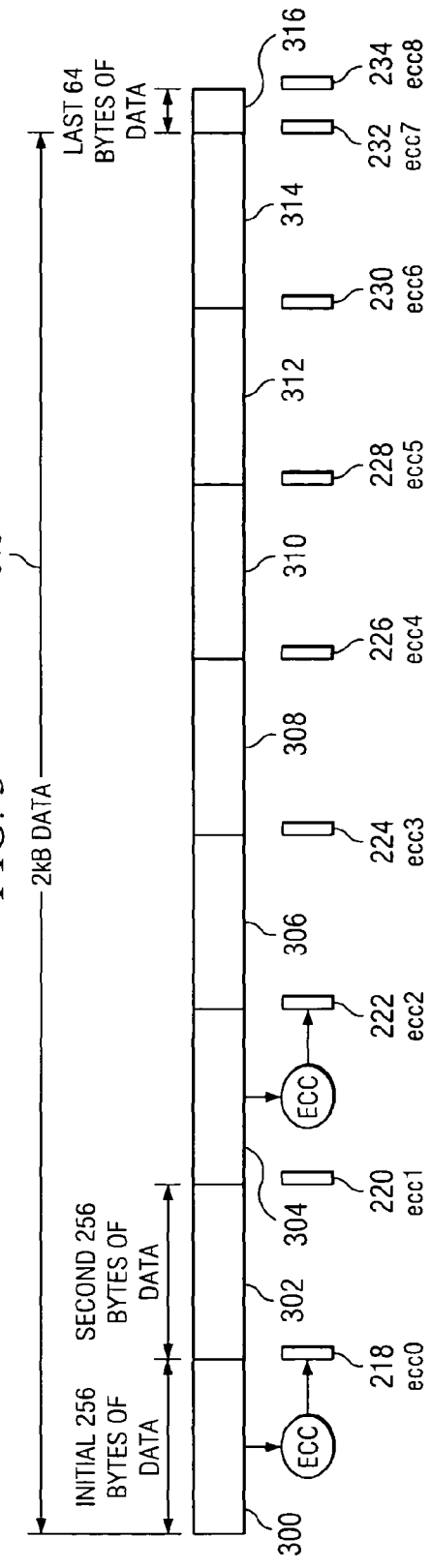
FIG. 3 illustrates a block diagram of ECC register memory allocation in accordance with certain embodiments of the invention.

Referring now to FIGS. 2 and 3, FIG. 3 provides an illustrative embodiment wherein a full page of NAND Flash memory 214 is defined as 2 KB of data 318 plus a "spare area" of 64 bytes 316 and the ECC256/512 signal to the ECC engine 202 is selected to be 256 bytes. An initial 256 bytes of data 300 may be received by the ECC engine 202. The ECC engine 202 may compute the ECC for the initial 256 bytes of data 300 and store the results in ECC register 218. The ECC engine 202 then may receive a second 256 bytes of data 302, generate the corresponding ECC computations and store the ECC computations in ECC register 220. The process may continue in this fashion until the ECC is computed for a last 64 bytes of data 316 and stored in ECC register 234. In this manner, a full page of NAND Flash memory 214 may be calculated without any delays for calculating the ECC. This process may accommodate any data size.

Figure 4A:
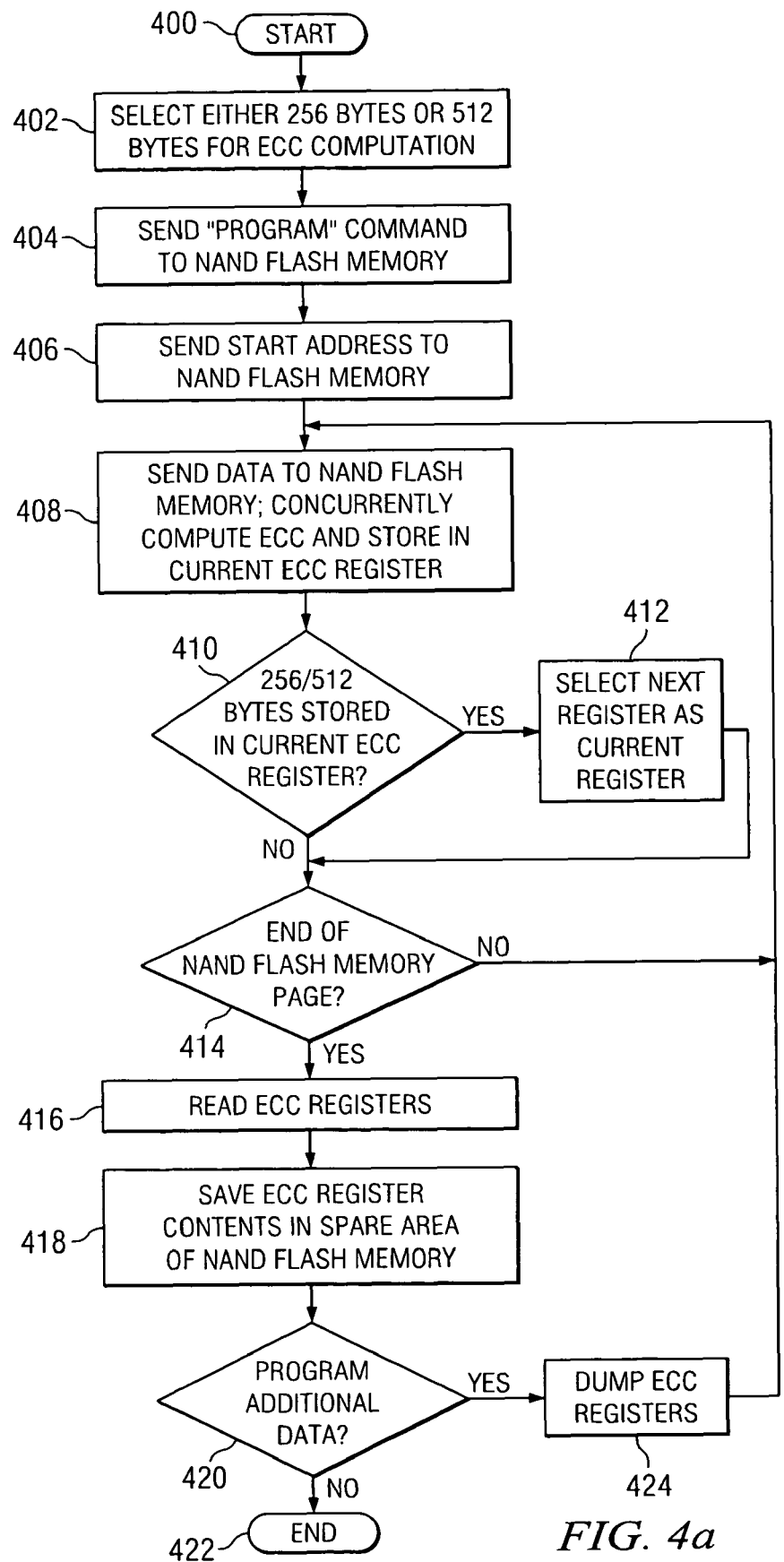
FIG. 4a illustrates a flow diagram of a NAND Flash memory programming operation in accordance with certain embodiments of the invention.

FIG. 4a provides a flowchart of an illustrative NAND Flash memory 214 programming operation. The process may begin with the selection of either 256 bytes or 512 bytes as the ECC computation size (block 402). The ECC computation size may be selected by an end user, a processor, or any other suitable entity. The NAND Flash controller 200 then may initiate the programming process by sending a "program" command to the NAND Flash memory 214 (block 404). The starting address of the NAND Flash memory 214 where data may be written also may be sent to the NAND Flash memory 214 (block 406). Data then may be sent to the NAND Flash memory 214 and the ECC Engine 202 may concurrently compute the ECC and store the ECC in the current ECC register 218-234 (block 408). If 256 bytes or 512 bytes of data (as selected in block 402) have been stored in the current ECC register 218-234 (block 410), then switch 238 may select the next ECC register 218-234 as the current register (block 412). If the end of a full page of NAND Flash memory 214 has been reached (block 414), the ECC registers 218-234 may be read (block 416) and saved in a spare area of NAND Flash memory 214 (block 418). If there exists additional data to be programmed to the NAND Flash memory 214 (block 420), the ECC registers may be dumped (block 424), the data may be sent to the NAND Flash memory and the ECC may be concurrently computed and stored in an ECC register 218-234 (block 408). The process may continue until all data intended for transmission are sent to the NAND Flash memory 214. Otherwise, the programming process may be complete (block 422).

Figure 4B:
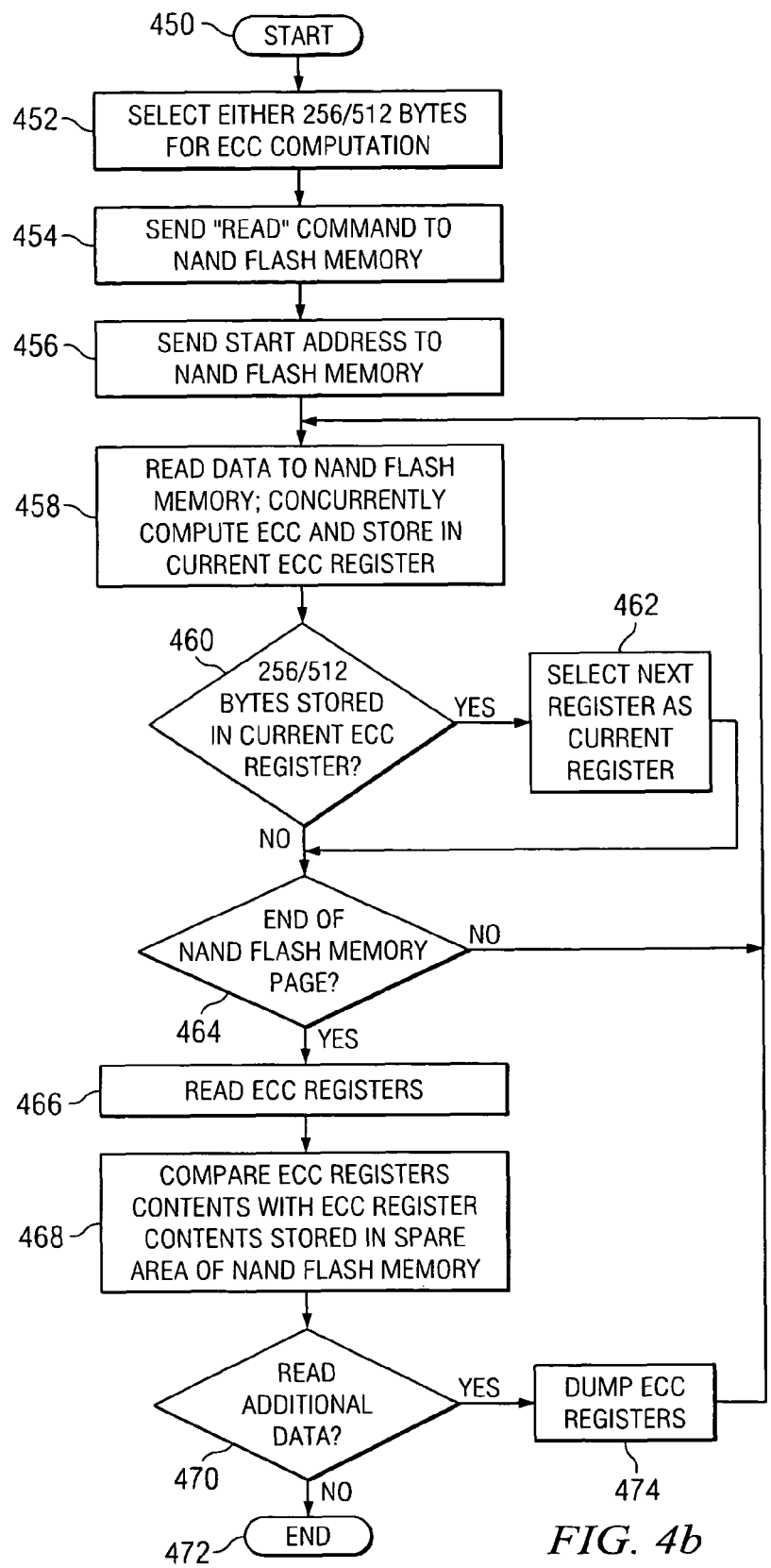
FIG. 4b illustrates a flow diagram of a NAND Flash memory read operation in accordance with certain embodiments of the invention.

FIG. 4b provides a flowchart of an illustrative NAND Flash memory 214 read operation. The process may begin with the selection of either 256 bytes or 512 bytes as the ECC computation size (block 452). The ECC computation size may be selected by an end user, a processor, or any other suitable entity. The NAND Flash controller 200 may initiate the reading process by sending a "read" command to the NAND Flash memory 214 (block 454). The starting address of the NAND Flash memory 214 from which data may be read also may be sent to the NAND Flash memory 214 (block 456). Data then may be read from the NAND Flash memory 214 and the ECC engine 202 may concurrently compute the ECC and store the ECC in the current ECC register 218-234 (block 458). If 256 bytes or 512 bytes of data (as selected in block 452) have been stored in the current ECC register 218-234 (block 460), then switch 238 may select the next ECC register 218-234 as the current register (block 462). If the end of a full page of NAND Flash memory 214 has been reached (block 464), the ECC registers 218-234 may be read (block 466) and compared with the ECC registers 218-234 stored in the spare area of NAND Flash memory 214 as indicated in block 418 of FIG. 4A (block 468). Such a comparison between the ECC generated when a particular data was written and the ECC generated when the same data was read enables the host processor 135 to determine whether any data errors were precipitated by the NAND Flash memory 214. The host processor 135 may correct existing data errors using any of a variety of external software.

If there exists additional data to be read from the NAND Flash memory 214 (block 470), the ECC registers may be cleared (block 474), the data may be read from the NAND Flash memory 214 and the ECC may be concurrently computed and stored in an ECC register 218-234 (block 458). The process may continue until all data intended for transmission are read from the NAND Flash memory 214. Otherwise, the reading process may be complete (block 472).

The above discussion is meant to be illustrative of the principles and various embodiments of the present invention. Numerous variations and modifications will become apparent to those skilled in the art once the above disclosure is fully appreciated. It is intended that the following claims be interpreted to embrace all such variations and modifications.

What is claimed is:

1. A method, comprising:
    transferring a data block between a flash memory and a memory controller;
    computing an ECC for said data block while transferring the data block; and
    selectively storing the ECC in a plurality of registers using a switching mechanism, the storing of the ECC occurring concurrently with transferring the data block.

2. The method of claim 1, wherein transferring the data block comprises transferring the data block between a NAND Flash memory and the memory controller.

3. The method of claim 1, wherein selectively storing the ECC further comprises
storing a first portion of the ECC in a first register; and
storing a second portion of the ECC in a second register if the first register is full.

4. The method of claim 3, wherein storing in a second register comprises selecting the second register using the switching mechanism.

5. The method of claim 1, wherein computing the ECC comprises performing the exclusive- or function.

6. A system, comprising:
a flash memory;
a controller coupled to the flash memory;
a switch coupled to the controller; and
said controller is configured to shift a data block between the flash memory and the controller and compute an ECC for said data block, said controller computing said ECC for said data block concurrently with shifting said data block between the flash memory and the controller; and
said system is configured to selectively store the ECC in a plurality of registers using the switch, while the controller shifts the data block.

7. The system of claim 6, wherein the flash memory is a NAND Flash memory.

8. The system of claim 6, wherein the system is configured to
store a first portion of the ECC in a first register; and
store a second portion of the ECC in an alternate register if the first register is full.

9. The system of claim 8, wherein the controller is configured to transfer contents of all registers to memory if all registers are full.

10. The system of claim 8, wherein the switch configured to select the alternate register.

11. The system of claim 10, wherein the switch is in the controller.

12. The system of claim 8, wherein the first register is in the controller.

13. The system of claim 8, wherein the alternate register is in the controller.

14. The system of claim 6, wherein the controller is configured to compute the ECC while performing the exclusive-or function.

15. A system comprising:
a means for storing a data block;
a means for controlling the data block;
a means for computing an ECC of the data block;
a means for shifting the data block between the means for storing and the means for controlling while computing an ECC for said data block; and
a means for selectively storing the ECC in a plurality of registers while shifting the data block.

16. The system of claim 15, wherein the means for storing is a NAND Flash memory.

17. The system of claim 15, wherein the means for selectively storing the ECC is configured to
store the ECC in a first register; and
store the ECC in an alternate register if the first register is full.

18. The system of claim 17, wherein the means for selectively storing the ECC is a switch configured to select the alternate register.

19. The system of claim 15, wherein the system is configured to transfer contents of at least one register to memory if all registers are full.

20. The system of claim 15, wherein the system is configured to compute the ECC while performing the exclusive- or function.

21. A memory controller configured to couple to a memory, comprising:
a memory interface;
an ECC engine configured to compute an ECC while transferring a data block between the ECC engine and memory; and
a switching mechanism coupled to the ECC engine, the ECC engine configured to selectively store the ECC in a plurality of registers using the switching mechanism, while transferring the data block.

22. The memory controller of claim 21, further comprising:
a register bank coupled to the switching mechanism, comprising at least one register;
wherein the ECC engine configured to store the ECC in a register selected by the switching mechanism, the register having space available for ECC storage.

23. The memory controller of claim 21, wherein the controller is configured to transfer a data block while transferring the data block between the ECC engine and a flash memory.

24. The memory controller of claim 21, wherein the controller is configured to transfer a data block while transferring the data block between the ECC engine and a NAND Flash memory.

25. The memory controller of claim 21, wherein the ECC engine is configured to transfer a data block by reading the data block from memory.

26. The memory controller of claim 21, wherein the ECC engine is configured to transfer a data block by writing the data block to memory.

* * * * *